US008592288B2

(12) United States Patent
Fornara et al.

(10) Patent No.: US 8,592,288 B2
(45) Date of Patent: Nov. 26, 2013

(54) STORAGE OF AN IMAGE IN AN INTEGRATED CIRCUIT

(75) Inventors: Pascal Fornara, Pourrieres (FR); Fabrice Marinet, Chateauneuf le Rouge (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 13/615,104

(22) Filed: Sep. 13, 2012

(65) Prior Publication Data

US 2013/0011944 A1 Jan. 10, 2013

Related U.S. Application Data

(62) Division of application No. 12/538,336, filed on Aug. 10, 2009, now Pat. No. 8,344,391.

(30) Foreign Application Priority Data

Aug. 19, 2008 (FR) ..................................... 08 55628

(51) Int. Cl.
*H01L 21/326* (2006.01)
*H01L 21/479* (2006.01)
(52) U.S. Cl.
USPC .................... 438/466; 438/467; 257/E21.592
(58) Field of Classification Search
USPC ........................... 438/466, 467; 257/E21.592
See application file for complete search history.

(56) References Cited

U.S. PATENT DOCUMENTS

| 6,759,262 B2 | 7/2004 | Theil et al. |
| 2002/0051071 A1 | 5/2002 | Itamo et al. |
| 2006/0203591 A1* | 9/2006 | Lee .............................. 365/225.7 |
| 2009/0085080 A1* | 4/2009 | Han .............................. 257/292 |
| 2009/0305499 A1 | 12/2009 | Gambino et al. |

OTHER PUBLICATIONS

French Search Report dated Mar. 20, 2009, from corresponding French Application No. 08/55628.
Song Z G et al:, "*Front-end processing defect localization by contact-level passive voltage contrast technique and root cause analysis*" Physical and Failure Analysis of Integrated Circuits, 2002. IPFA 2002. Proceedings of the 9th International Symposium on the Jul. 8-12, 2002, Piscataway, NJ, IEEE, Jul. 8, 2002, pp. 97-100, XPO10597768.
Li Y G et al:, "*Test structure failed node localization and analysis from die backside*", Physical and Failure Analysis of Integrated Circuits, 2008. IPFA 2008, .15th International Symposium on the, IEEE, Piscataway, NJ, USA, Jul. 7, 2008, pp. 1-3, XP031297711.
Zhigang Song et al:, "*Open contact analysis of single bit failure in 0.18 [mu]n technology*" Microelectronics Reliability Elsevier UK, vol. 42, No. 12, Dec. 2002, XP002520276, pp. 1997-2001.

(Continued)

*Primary Examiner* — Daniel Whalen
(74) *Attorney, Agent, or Firm* — Wolf, Greenfield & Sacks, P.C.

(57) ABSTRACT

An integrated circuit including a substrate of a semiconductor material and first metal portions of a first metallization level or of a first via level defining pixels of an image. The pixels are distributed in first pixels, for each of which the first metal portion is connected to the substrate, and in second pixels, for each of which the first metal portion is separated from the substrate by at least one insulating portion.

9 Claims, 6 Drawing Sheets

(56) References Cited

OTHER PUBLICATIONS

Song Z G et al:, "*Application of contact-level ion-beam induced passive voltage contrast in failure analysis of static random access memory*" 2001, Proceedings of the International Symposium on the Physical and Failure Analysis of Integrated Circuits, IPFA 2001 Institute of Electrical and Electronics Engineers Inc.US, pp. 103-106, XP002520277.

* cited by examiner

STORAGE OF AN IMAGE IN AN INTEGRATED CIRCUIT

CROSS REFERENCE TO RELATED APPLICATIONS

This application claims the priority benefit of U.S. patent application Ser. No. 12/538,336, filed on Aug. 10, 2009, which application is claims priority benefit of French patent application number 08/55628, filed on Aug. 19, 2008, entitled "STORAGE OF AN IMAGE IN AN INTEGRATED CIRCUIT," which are hereby incorporated by reference to the maximum extent allowable by law.

BACKGROUND OF THE INVENTION

1. Field of the Invention

The present disclosure generally relates to integrated circuits and, more specifically, to the non-volatile storage of an image in an integrated circuit during the circuit manufacturing.

2. Discussion of the Related Art

In many cases, it is needed to permanently store an image in an integrated circuit on manufacturing of the integrated circuit. The image for example shows an identifier of the wafer on which the integrated circuit is manufactured, the position of the integrated circuit on the wafer, an identifier of the wafer batch to which the wafer of the integrated circuit belongs, etc.

Generally, to permanently store an image in the form of binary data in an integrated circuit, a ROM-type memory, an electrically erasable programmable read-only memory (or EEPROM), etc. is generally used.

A disadvantage is that the image to be stored may be unavailable at the time when the etch masks used during the integrated circuit manufacturing are defined. Further, the image to be stored may vary from one wafer to the other, especially when it shows identifiers of wafers and of wafer batches. Since the storage of data in a ROM generally requires the use of at least one specific mask for the forming of the memory cell connections, it is not compatible, for a manufacturing of circuits at an industrial scale, to have to multiply the number of masks to be used.

Further, it is desirable for the stored image to remain accessible even when the integrated circuit is disabled. As an example, when the stored image represents the batch identifier, the wafer identifier, the integrated circuit position, etc., it is generally desired to access this image when the circuit is malfunctioning, to ease the determination of the causes of this malfunction. When the image is stored in a ROM, an EEPROM, etc., it is no longer possible to read it when the circuit is no longer functional.

An example of a method for permanently storing an image at the level of an integrated circuit, enabling the stored image to remain accessible when the circuit is disabled and enabling to easily store different images from one integrated circuit to the other, comprises scanning the upper surface of the integrated circuit with a laser to etch the image in the form of patterns on a portion of the integrated circuit. However, such a method needs to be implemented separately on each integrated circuit and is thus not compatible with the manufacturing of integrated circuits at an industrial scale. Further, the images to be stored may be unavailable at the time when the laser etch method is to be implemented.

SUMMARY OF THE INVENTION

A method for permanently storing an image at the level of an integrated circuit is disclosed, the image remaining accessible when the integrated circuit is disabled, where the image storage can be performed simply and at a decreased cost an industrial scale.

An object of an embodiment of the invention is to enable the image storage at the level of the integrated circuit after the manufacturing of the integrated circuit and possibly after steps of test and/or of assembly of the integrated circuit.

Another object of an embodiment of the invention is to make the reading of the image stored at the level of the integrated circuit particularly simple.

Embodiments of present invention also aim at an integrated circuit at the level of which an image is permanently stored, the image remaining accessible when the integrated circuit is disabled, where the image can be read in a simple way.

To achieve all or part of these objects as well as others, an embodiment of the present invention provides an integrated circuit comprising a substrate of a semiconductor material, first and second pixels, each pixel being formed of a first metal portion of a first metallization or via level, the first metal portion of each first pixel being connected to the substrate and the first metal portion of each second pixel being separated from the substrate by at least one insulating portion, and for each pixel, a capacitive coupling element connecting the pixel to a selection element.

According to an embodiment of the present invention, each pixel is connected, by an electric path, to a second metal portion of a second metallization level closest to the substrate than the first level, and, for each of the first pixels, the associated second metal portion is connected to the substrate, and, for each of the second pixels, the associated second metal portion is separated from the substrate by at least one insulating portion.

According to an embodiment of the present invention, each pixel has a corresponding two-state luminance and/or chrominance attribute, and for each first pixel, the corresponding attribute is at a first state and, for each second pixel, the corresponding attribute is at a second state.

According to an embodiment of the present invention, for each pixel, the associated capacitive coupling element connects the associated second portion to a selection element.

According to an embodiment of the present invention, the capacitive coupling element is a MOS transistor comprising first and second gates, the second gate being floating and being connected to the associated second portion, the first gate being connected to the selection element.

According to an embodiment of the present invention, the capacitive coupling element is a MOS capacitor comprising first and second armatures, the first armature being connected to the associated second portion and the second armature being connected to the selection element.

According to an embodiment of the present invention, the second metal portion associated with each first pixel is connected to the gate of a first MOS transistor having a gate insulator which has not been altered and the second metal portion associated with each second pixel is connected to the gate of a second MOS transistor having a gate insulator which has been altered to be conductive.

According to an embodiment of the present invention, the selection element is a first conduction terminal of a MOS power transistor having a second conduction terminal connected to a power supply terminal and having a gate adapted for receiving a selection signal.

An example of the present invention provides a method for storing an image in an integrated circuit comprising a substrate of a semiconductor material, pixels being formed of first metal portions of a first metallization or via level, each pixel being separated from the substrate by at least one insulating portion, and each pixel being coupled to a selection element via a capacitive coupling element, and a voltage is applied between at least several pixels and the substrate, via the corresponding capacitive coupling element, to alter said insulating portion and electrically connect the first metal portion to the substrate.

According to an embodiment of the present invention, each pixel is connected by an electric path to a second metal portion of a second metallization level, closest to the substrate than the first level, each second metal portion being separated from the substrate by said at least one insulating portion, and, for said at least several pixels, said voltage is applied, via the associated capacitive coupling element, between the second metal portion associated with each of said several pixels and the substrate.

The foregoing objects, features, and advantages of the present invention will be discussed in detail in the following non-limiting description of specific embodiments in connection with the accompanying drawings.

DETAILED DESCRIPTION

Figure 1:
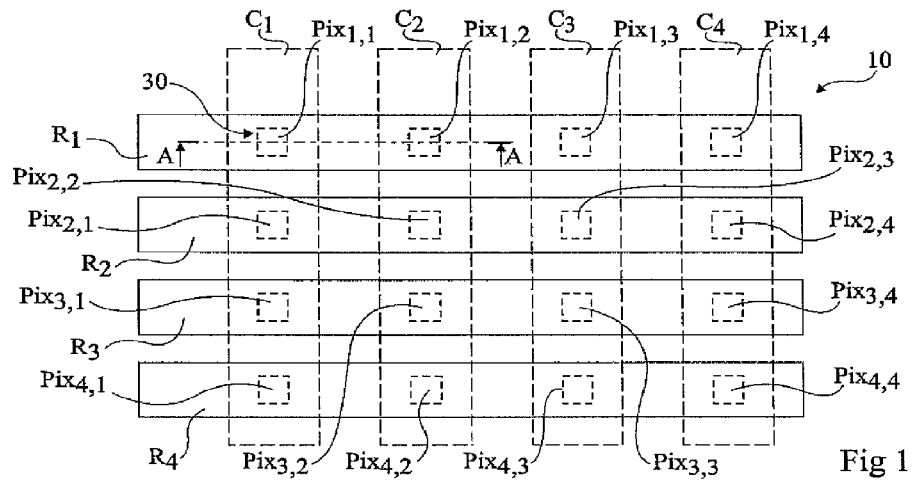
FIG. 1 is a simplified top view of an integrated circuit according to an embodiment of the present invention.

For clarity, only those steps and elements which are useful to the understanding of the present invention have been shown and will be described. Further, the same elements have been designated with the same reference numerals in the different drawings and, moreover, as usual in the representation of integrated circuits, the various drawings are not to scale.

In the following description, the assembly of metal tracks simultaneously formed during the integrated circuit manufacturing process is called a metallization level. These may be metal tracks lying at the surface of an insulating layer or leveling the surface of an insulating layer. A conductive portion crossing an insulating layer and connecting a metal track of a given metallization level to a metal track of an adjacent metallization level is called a via. The assembly of vias simultaneously formed during the integrated circuit manufacturing process is called a via level. Vias may be formed simultaneously to the metal tracks of a given metallization level. In this case, the via and metallization levels are confounded.

The present disclosure relates to storing an image at the level of a portion of an integrated circuit by means of pixels formed by metal portions of a same metallization level or of a same via level, preferably the last or the penultimate metallization level or the intermediary via level between the last and penultimate metallization levels. Each pixel has an associated chrominance and/or luminance attribute that can take two states. The image is stored by letting the pixels float or by electrically connecting them to the substrate during a write operation. The image reading may be performed by adapted imaging techniques enabling to make out floating pixels from connected pixels. Such techniques for example may be passive voltage contrast imaging techniques.

Figure 2:
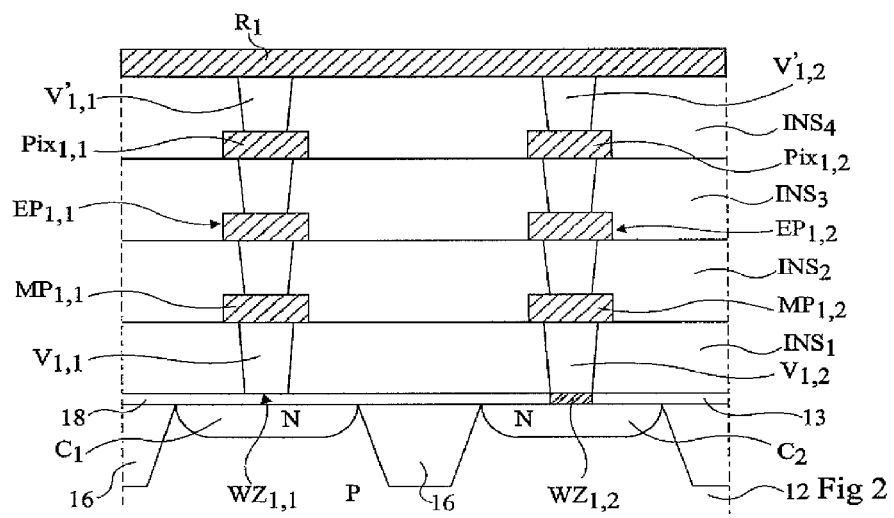
FIG. 2 is a cross-section view of the integrated circuit of FIG. 1 along line A-A.

FIG. 1 is a partial simplified top view of an integrated circuit 10 according to an embodiment of the present invention and FIG. 2 shows a cross-section of circuit 10 of FIG. 1 along line A-A.

Circuit 10 comprises a substrate 12 of an undoped or P-type doped semiconductor material, for example, polysilicon, having an upper surface 13. Substrate 12 comprises active areas, for example, N-type doped areas, which extend into substrate 12 from upper surface 13 and which have an elongated shape. As an example, four parallel active areas $C_1$ to $C_4$ are shown in FIG. 1 in stripe-dot lines and two adjacent active areas $C_1$ and $C_2$ are shown in FIG. 1. Active areas $C_1$ to $C_4$ are separated by insulating regions 16. An insulating layer 18 covers surface 13. Insulating layer 18 is covered with a stack of insulating layers $INS_1$ to $ISN_4$.

In the present embodiment, integrated circuit 10 comprises metal portions formed in four different metallization levels M, where k is an integer varying from 1 to 4. The metal portions of first metallization level $M_1$ are the closest to substrate 12 and the metal portions of last metallization level $M_4$ are the most distant from substrate 12. As an example, the conductive tracks of metallization levels $M_1$ to $M_3$ are made of copper and the metal tracks of last metallization level $M_4$ are made of aluminum. In the present embodiment, the metal portions of metallization level $M_k$ are arranged on insulating layer $INS_k$.

Pixels $Pix_{i,j}$, where i and j are integers varying between 1 and 4 in the present example, are formed above active areas $C_1$ to $C_4$. In FIG. 1, each pixel $Pix_{i,j}$ has been represented by a square in dotted lines. As an example, the pixels are arranged in rows and in columns. Active areas $C_1$ to $C_4$ are oriented along the pixel columns, four pixels $Pix_{1,j}$, $Pix_{2,j}$, $Pix_{3,j}$, and $Pix_{4,j}$ being associated with each active area $C_j$.

In the present embodiment, each pixel $Pix_{i,j}$ is formed by a metal portion of penultimate level $M_3$. Each metal portion $Pix_{i,j}$ is connected to a metal portion $MP_{i,j}$ of first metallization level $M_1$ by an electric path $EP_{i,j}$ formed by the serializing of vias and of a metal portion of metallization level $M_2$. Each metal portion $MP_{i,j}$ is connected to a via $V_{i,j}$ crossing first insulating layer $INS_1$ and extending all the way to insulating layer 18. A write area of pixel $WZ_{i,j}$, which corresponds to the portion of insulating layer 18 interposed between via $V_{i,j}$ and active area $C_j$, is associated with each pixel $Pix_{i,j}$.

Parallel metal tracks $R_1$ to $R_4$ of last metallization level $M_4$ extend along the pixel rows. Each metal track $R_i$ is connected, by vias $V'_{i,j}$ crossing insulating layer $INS_3$, to pixels $Pix_{i,j}$, where j varies from 1 to 4. In other words, each track $R_1$ and $R_4$ is connected to all the pixels in a same row.

The storage of an image is obtained, for each pixel $Pix_{i,j}$, in a write operation performed once integrated circuit 10 has been manufactured. It comprises altering, for some pixels $Pix_{i,j}$, write area $WZ_{i,j}$ to make it conductive. For each pixel $Pix_{i,j}$ for which write area $WZ_{i,j}$ has not been altered, the base of via $V_{i,j}$ is electrically insulated from substrate 12. For each pixel $Pix_{i,j}$ for which write area $WZ_{i,j}$ has been altered, everything occurs as if the base of via $V_{i,j}$ were electrically connected to the underlying active area $C_j$. As an example, in FIG. 1, pixels $Pix_{1,1}$, $Pix_{4,2}$, and $Pix_{3,4}$ have their base insulated from substrate 12 by insulating layer 18 and the other pixels have their base connected to substrate 12. In FIG. 1, altered write area $WZ_{1,2}$ has been shown by a hatched region.

For each pixel $Pix_{i,j}$ for which the portion of insulating layer 18 separating via $V_{i,j}$ from the underlying active area $C_j$ is desired to be altered, the write operation comprises setting the associated metal track $R_i$ to a high reference voltage VPP and setting active area $C_j$ to a low reference voltage, the other active areas being maintained at voltage VPP. As an example, the low reference voltage corresponds to ground GND and is equal to 0 V and high reference voltage VPP, referenced to ground GND, is greater than some ten volts, for example, on the order of 12 V. High and low reference voltages VPP and GND are selected so that the voltage which settles between via $V_{i,j}$ and the underlying active area $C_j$ is sufficiently high to cause the breakdown of the intermediary portion of insulating layer 18 and thus ensure the electric connection between the base of via $V_{i,j}$ and active area $C_j$. As an example, insulating layer 18 may correspond to a bilayer having a thickness on the order of 60 nm, comprising an oxide layer on the order of 20 nm covered with a nitride layer on the order of 40 nm. A voltage between via $V_{i,j}$ and active area $C_j$ greater than some ten volts enables to ensure the breakdown of write area $WZ_{i,j}$. The breakdowns of the write areas $WZ_{i,j}$ associated with several pixels $Pix_{i,j}$ in the same row may be performed simultaneously. Once the write operation is over, integrated circuit 10 may be used normally.

An image reading operation is performed by removing metal tracks $R_1$ to $R_4$ from last metallization level $M_4$, vias $V'_{i,j}$, and insulating layer $INS_4$ to expose metal portions $Pix_{i,j}$ of metallization level $M_3$. By the removal of metal tracks $R_1$ to $R_4$, each pixel $Pix_{i,j}$ having an unaltered associated write area $WZ_{i,j}$ is electrically floating. Each pixel $Pix_{i,j}$ for which the associated write area $WZ_{i,j}$ has been altered is electrically connected to the corresponding active area $C_j$. According to a variation, only metal tracks $R_1$ to $R_4$ are removed. In this case, vias $V'_{i,j}$ play the role of pixels.

A read operation may be performed by passive voltage contrast or PVC imaging methods. Such methods are described, for example, in the work entitled "Microelectronics Failure Analysis: Desk Reference Fifth Edition" published in 2004 by EDFAS Desk Reference Committee. A PVC method comprises projecting an ion or electron beam onto a surface to be observed and detecting the low-energy secondary electrons which are emitted by the surface. An image having its contrast depending on the amount of detected electrons is obtained. In the case of electrically-insulated structures, few secondary electrons are detected. Indeed, positive charges tend to build up at the surface of these structures, thus attracting the secondary emitted electrons which are recaptured. These structures appear as dark on the obtained image. In the case of structures electrically connected to a source of a low reference voltage, for example, the ground, many secondary electrons are detected since there is no electron recapture. These structures appear as lighter.

The PVC method is implemented by setting substrate 12 to low reference voltage GND. This can be done even if integrated circuit 10 is disabled. The setting to the low voltage of substrate 12 enables a carrying off of the charges present in the pixels $Pix_{i,j}$ electrically connected to the corresponding active area $C_j$ due to the leakage currents at the junction between active area $C_j$ and substrate 12. Pixels $Pix_{i,j}$ thus appear with a light tone on the obtained image while the electrically-isolated pixels $Pix_{i,j}$ appear with a dark tone. Insulating layer $INS_3$ also appears with a dark tone in the obtained image. In the obtained image, each pixel thus appears according to a two-state luminance attribute: light or dark.

Figure 3:
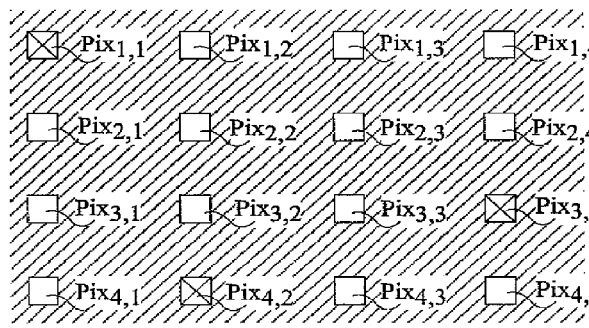
FIG. 3 is an image obtained in an operation of reading of the image stored at the level of the circuit of FIG. 1.

FIG. 3 shows an image obtained by implementation of a method for reading the stored image at the level of circuit 10 of FIG. 1. Pixels $Pix_{i,j}$ are represented by squares. As an example, only pixels $Pix_{1,1}$, $Pix_{4,2}$, and $Pix_{3,4}$, marked with a cross in FIG. 3, are insulated from substrate 12 by insulating layer 18 and appear with a dark tone on the obtained image.

As a variation, the read operation may be implemented by a conduction atomic force microscopy method or C-AFM method. A C-AFM method comprises displacing a tip above the surface of circuit 10, the tip being maintained at a distance from the surface of circuit 10. Substrate 12 is set to a low reference voltages and the tip is set to a high reference voltage. The intensity of the current crossing the tip is measured. The measured intensity varies according to whether the tip is in contact with a floating pixel or with a pixel electrically connected to the substrate. An image is obtained, for example, with a grey level or with a color tone which depends on the intensity of the measured current.

Pixels $Pix_{i,j}$ may be arranged in rows and in columns to form a matrix display. As a variation, pixels $Pix_{i,j}$ may be arranged as segments or diodes of a digital display. As a variation, pixels $Pix_{i,j}$ may have shapes different from one another.

FIGS. 4A to 4D are cross-section views similar to FIG. 2 of structures obtained at successive steps of a method for manufacturing circuit 10 according to an embodiment of the present invention.

Figure 4A:
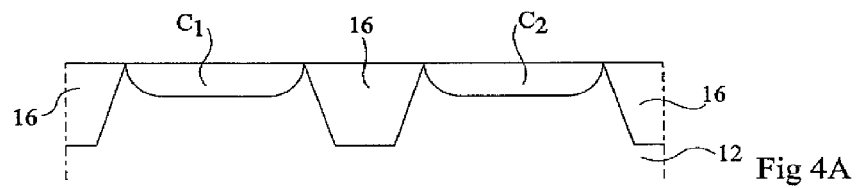
FIGS. 4A to 4D show the structures obtained at successive steps of a method for manufacturing the circuit of FIG. 2 according to an embodiment of the present invention.

FIG. 4A shows the structure obtained after having formed, in substrate 12, active areas $C_1$ and $C_2$ separated by insulating regions 16. Insulating regions 16 are, for example, formed by an STI method (shallow trench insulation).

Figure 4B:
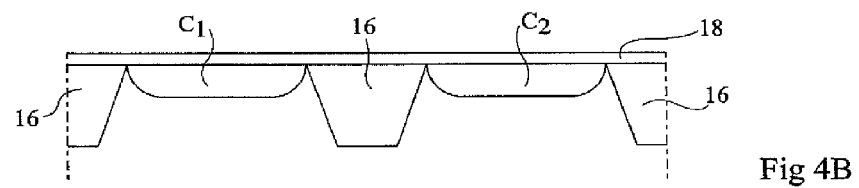

FIG. 4B shows the structure obtained after having successively deposited an oxide layer and a nitride layer forming insulating layer 18.

Figure 4C:
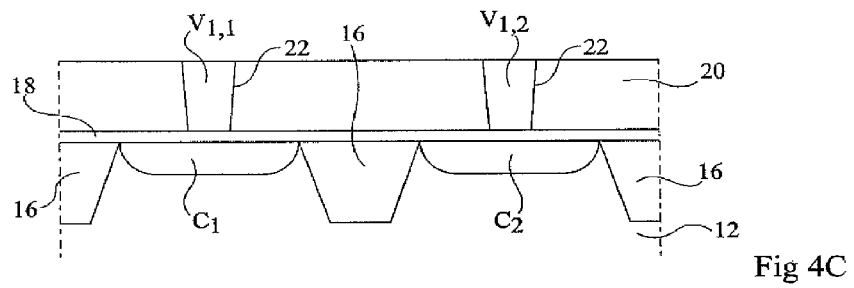

FIG. 4C shows the structure obtained after having deposited insulating layer $INS_1$, for example, made of silicon oxide, on insulating layer 18, after having etched openings 22 in layer $INS_1$, and after having formed vias $V_{1,1}$ and $V_{1,2}$ in openings 22. Insulating layer 18 acts as an etch stop layer in the etching of openings 22. Thereby, vias $V_{1,1}$ and $V_{1,2}$ formed in openings 22 are not in electric contact with the underlying active areas $C_1$, $C_2$.

Figure 4D:
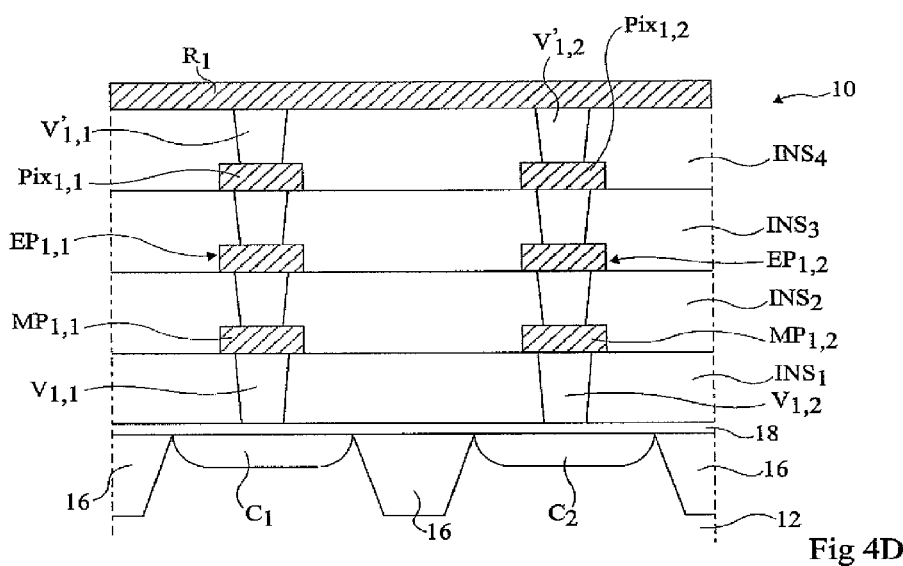

FIG. 4D shows the structure obtained after deposition of insulating layers $INS_2$, $INS_3$, and $INS_4$ and the forming of electric paths $EP_{1,1}$ and $EP_{1,2}$, of pixels $Pix_{1,1}$ and $Pix_{1,2}$, of vias $V'_{1,1}$ and $V'_{1,2}$, and of metal track $R_1$. An integrated circuit in which all pixels $Pix_{i,j}$ are floating is then obtained. The previously-described write step in which insulating layer 18 is altered is then carried out at the level of certain pixels.

Figure 5:
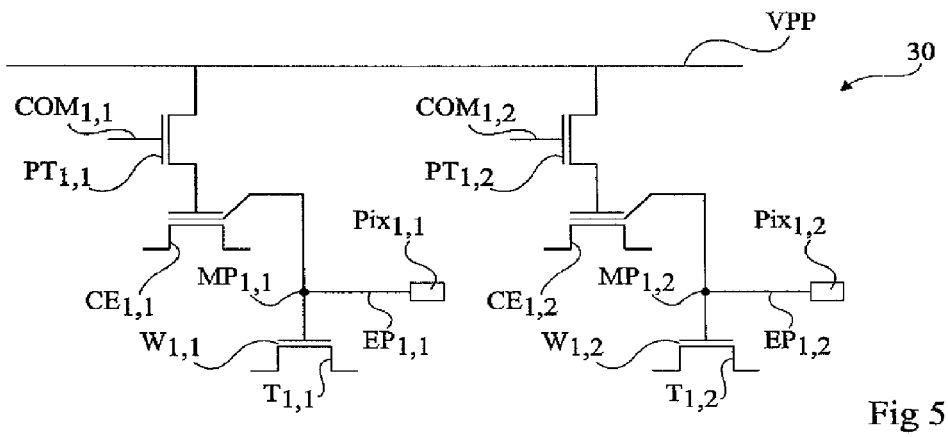
FIG. 5 shows an electric diagram of an integrated circuit according to another embodiment of the present invention.

FIG. 5 shows a partial electric diagram of an integrated circuit 30 according to another embodiment of the present invention. In the present embodiment, each pixel $Pix_{i,j}$ is formed by a metal portion of last metallization level $M_4$. In FIG. 5, two pixels $Pix_{1,1}$ and $Pix_{1,2}$ of a pixel array have been shown. In the present embodiment, for each pixel $Pix_{i,j}$, the associated write area $WZ_{i,j}$ corresponds to the gate insulator of a MOS transistor $T_{i,j}$. Transistor $T_{i,j}$ is a thin-oxide transistor or low-voltage transistor. Further, each metal portion $MP_{i,j}$ is connected by a coupling element $CE_{i,j}$ to a conduction terminal (source or drain) of a power MOS transistor $PT_{i,j}$ having its other conduction terminal connected to a high reference voltage source VPP. Transistor $PT_{i,j}$ is called thick-oxide transistor or high-voltage transistor. Transistor $PT_{i,j}$ for example corresponds to an N-channel MOS transistor. The gate of transistor $PT_{i,j}$ receives a control signal $COM_{i,j}$. Coupling element $CE_{i,j}$ enables, as will be described in further detail hereinafter, to perform the write operation. Advantageously, coupling element $CE_{i,j}$ may correspond to a conventional electronic component such as a memory element of an electrically erasable programmable read-only memory or EEPROM having the structure of a dual-gate MOS transistor having a gate which is floating. Metal portion $MP_{i,j}$ is connected to the floating gate of memory element $CE_{i,j}$ and power transistor $PT_{i,j}$ is connected to the control gate of memory element $CE_{i,j}$. As compared with circuit 10, circuit 30 does not comprise active areas $C_j$. Circuit 30 has the advantage of using conventional electronic components.

Figure 6:
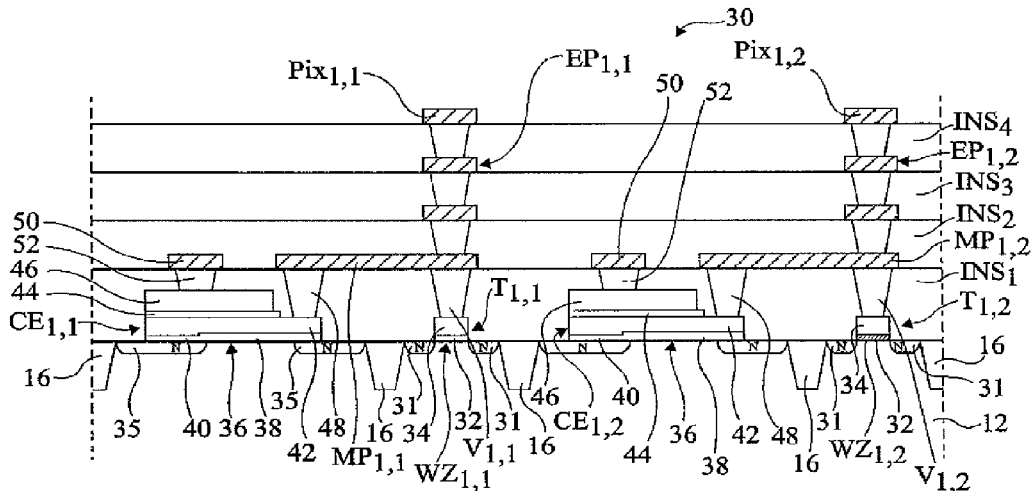
FIG. 6 is a partial simplified cross-section view of the integrated circuit of FIG. 5.

FIG. 6 is a cross-section view similar to FIG. 2 of pixels $Pix_{1,1}$ and $Pix_{1,2}$, of electric paths $EP_{1,1}$, $EP_{1,2}$, and of coupling elements $CE_{1,1}$ and $CE_{1,2}$ of integrated circuit 30. Each transistor $T_{i,j}$ comprises N-type doped areas 31 extending into substrate 12 on either side of an insulating portion 32 arranged on substrate 12, for example, a thin silicon oxide portion having a thickness of a few nanometers, for example, 2 or 3 nm. A portion 34 of a semiconductor material, for example, polysilicon, covers insulating portion 32. Regions 31 form source and drain regions of transistor $T_{i,j}$. Insulating portion 32 forms the gate insulator of transistor $T_{i,j}$ and corresponds to write area $WZ_{i,j}$. Semiconductor portion 34 forms the gate of transistor $T_{i,j}$. An insulating layer, not shown, may cover pixels $Pix_{i,j}$.

Each memory element $CE_{i,j}$ comprises N-type doped regions 35 extending into substrate 12 on either side of an insulating portion 36 arranged on substrate 12. Insulating portion 36 comprises a thick region 38, for example having a thickness on the order of 20 nm and a thinner region 40 for example having a thickness on the order of some ten nanometers. A conductive portion 42, for example, made of polysilicon, covers insulating portion 36. Portion 42 forms the floating gate of memory element $CE_{i,j}$. An insulating portion 44 partially covers semiconductor portion 42. A semiconductor portion 46 covers insulating portion 44. Portion 46 forms the control gate of memory element $CE_{i,j}$.

With respect to circuit 10, for each pixel $Pix_{i,j}$ of circuit 30, via $V_{i,j}$ connected to gate 32 of transistor $T_{i,j}$. Metal track $MP_{i,j}$ is connected to via $V_{i,j}$ and, further, to a via 48 having its base connected to floating gate 42 of memory element $CE_{i,j}$. A metal track 50 of the first metallization level connected, by a via 52 crossing insulating layer $INS_1$, to control gate 46 of memory element $CE_{i,j}$ has also been shown in FIG. 6, associated with each pixel $Pix_{i,j}$.

The writing of an image into integrated circuit 30 is carried out by altering the gate insulator 32 of transistor $T_{i,j}$ of certain pixels $Pix_{i,j}$ so that via $V_{i,j}$ pixel $Pix_{i,j}$ is electrically connected to underlying substrate 12. In FIG. 6, gate insulator 32 of transistor $T_{1,2}$ has been shown in hatching to show that it has been altered.

The writing step is carried out by setting substrate 12 to low reference voltage GND and by turning on the transistor $PT_{i,j}$ of each pixel $Pix_{i,j}$ which is desired to be electrically connected to substrate 12. The voltage of control gate 46 of memory element $CE_{i,j}$ then tends to substantially rise up to high reference voltage VPP. The stack of conductive and insulating portions 36, 42, 44, and 46 of memory element $CE_{i,j}$ forms a capacitive bridge. This results in a rise in the voltage of floating gate 42 of memory element $CE_{i,j}$ and thus in a rise in the voltage of gate 34 of transistor $T_{i,j}$ to a value sufficient to cause the breakdown of gate insulator 32 of transistor $T_{i,j}$. For example, a voltage between via $V_{i,j}$ and substrate 12 greater than some ten volts is sufficient to obtain the breakdown of a silicon oxide gate insulator 32 having a thickness of a few nanometers. To improve the rise of the voltage of gate 34 of transistor $T_{i,j}$, source and drain regions 35 of memory element $CE_{i,j}$ may be brought up to VPP during the write operation.

After the write operation, certain pixels $Pix_{i,j}$ are thus electrically isolated from substrate 12 by transistor $T_{i,j}$ having its gate insulator 32 left intact and by memory element $CE_{i,j}$ having a floating gate 42. Other pixels $Pix_{k,l}$ are electrically connected to substrate 12 via transistor $T_{k,l}$ having an altered gate insulator 32.

The read step is carried out as described previously with circuit 10 of FIGS. 1 and 2, but for the difference that only the metal portions of the last metallization level need to be exposed. Indeed, a PVC or C-AFM method may be carried out directly at the level of the metal portions of the last metallization level.

According to a variation of circuit 30, transistors $T_{i,j}$ may be replaced with a structure similar to circuit 10 in which each via $V_{i,j}$ is initially insulated from substrate 12 by an insulating layer 18 which is altered or left as such during the write operation.

FIGS. 7A to 7F are drawings similar to FIG. 6 and show structures obtained at successive steps of a method for manufacturing circuit 30 according to an embodiment of the present invention.

Figure 7A:
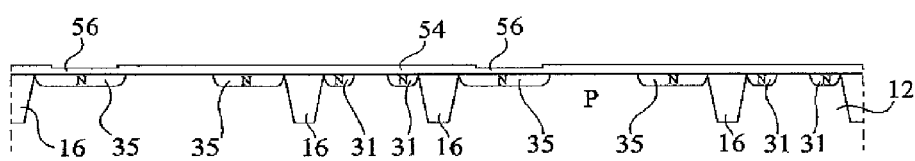
FIGS. 7A to 7F show the structures obtained at successive steps of a method for manufacturing the circuit of FIG. 6 according to an embodiment of the present invention.

FIG. 7A shows the structure obtained after the steps of:

forming, in substrate 12, separation regions 16 and N-type doped regions 31, 35;

depositing over the entire circuit an insulating layer 54, for example, a silicon oxide layer having a thickness on the order of 20 nanometers; and forming in oxide layer 54 thinned-down portions 56 at the locations of the memory elements. Each thinned-down portion 56 has, for example, a thickness smaller than 10 nanometers.

Figure 7B:
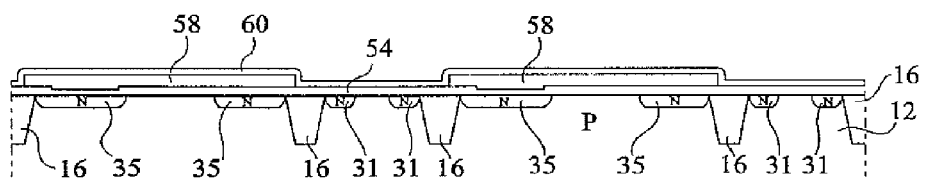

FIG. 7B shows the structure obtained after having deposited, over the entire circuit, a polysilicon layer having, for example, a 100-nanometer thickness, after having etched the polysilicon layer to delimit, at the level of the locations of each memory element, a polysilicon portion 58, and after having covered the entire circuit with an insulating layer 60 having a thickness on the order of 20 nanometers, corresponding, for example, to a silicon oxide layer or to a multiple-layer structure comprising a stacking of a silicon oxide layer, a silicon nitride layer, and a silicon oxide layer.

Figure 7C:
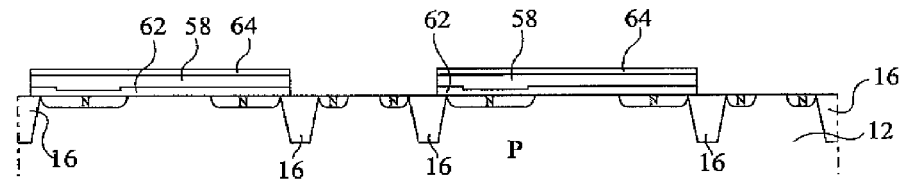

FIG. 7C shows the structure obtained after having etched insulating layers 54, 60 to delimit, at the locations of the memory elements, a portion 62 of insulating layer 54 and a portion 64 of insulating layer 60 on either side of polysilicon portion 58, insulating layers 54, 60 being removed at the locations of the transistors.

Figure 7D:
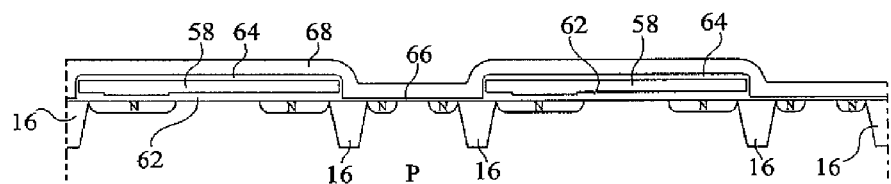

FIG. 7D shows the structure obtained after having formed an insulating layer 66, for example, a silicon oxide layer having a thickness of a few nanometers, on the circuit portions not covered with insulating layers 64 and after having covered the entire circuit with a polysilicon layer 68 for example having a thickness from 100 to 200 nanometers.

Figure 7E:
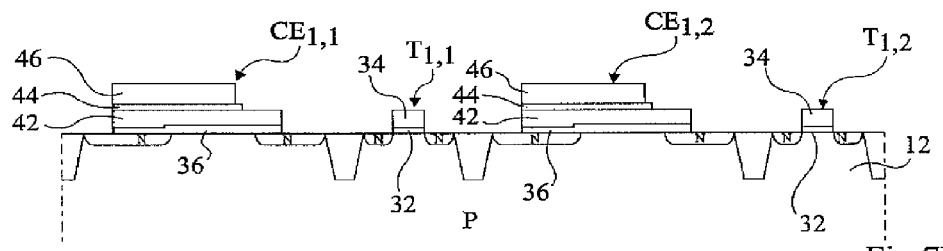

FIG. 7E shows the structure obtained after having carried out the steps of etching polysilicon layer 68, insulating portions 64, polysilicon portions 58, insulating portions 62, and insulating layer 66, to delimit, for each memory element $CE_{i,j}$, insulating portion 36, floating gate 42, insulating portion 44, and control gate 46, and to delimit for each transistor $T_{i,j}$, gate insulator 32 and gate 34.

Figure 7F:
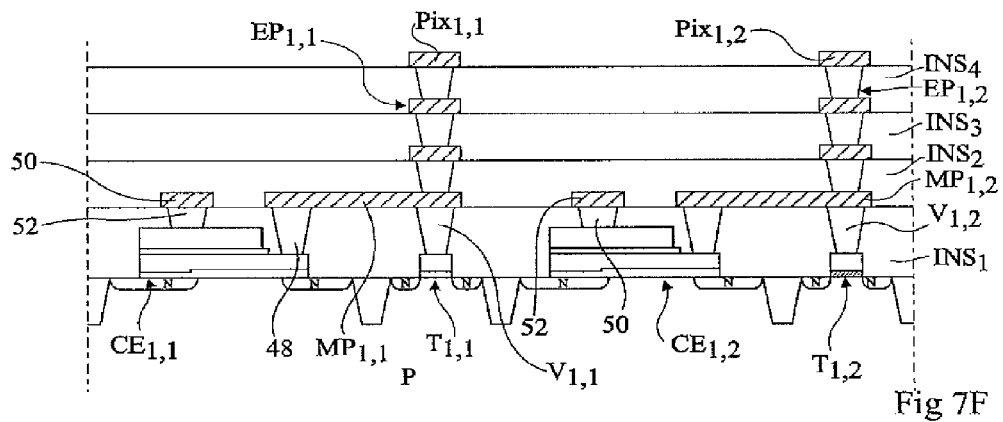

FIG. 7F shows the structure obtained after having covered the previous structure with the stacking of insulating layers $INS_1$, $INS_2$, $INS_3$, and $INS_4$ while forming the associated vias and metal portions. At the end of the previously-described method, each pixel $Pix_{i,j}$ is floating. The method carries on with the writing step.

In the previously-described embodiment, memory element $CE_{i,j}$ corresponds to a conventional memory element of an EEPROM. In this case, memory element $CE_{i,j}$ is associated with a selection transistor, not shown, and may be used, after a write operation, to verify whether the write operation has taken place properly. Indeed, for a pixel $Pix_{i,j}$ for which gate insulator 32 of transistor $T_{i,j}$ has not been altered, it is no longer possible to store charges in floating gate 42 of memory element $CE_{i,j}$ since these charges will be carried off towards substrate 12 by transistor $T_{i,j}$. The absence of charges in floating gate 42 of memory element $CE_{i,j}$ may be detected by a read operation of memory element $CE_{i,j}$.

One advantage of the previously-described embodiment is that the writing step is simplified compared with circuit 10. Indeed, during the writing step, a unique reference voltage is applied to the substrate, and each pixel can be addressed individually thanks to its associated selection element PTi,j. This allows, in particular, carrying out parallel writing operations on pixels from different lines and columns.

Another advantage of the previously described embodiment is that the reading step is simplified compared with circuit 10. Indeed, each pixel corresponds to a metal portion of the ultimate metal level M4. Thus, pixels are directly reachable for reading, without a previous step of removal of the metal tracks.

According to an alternative embodiment, insulating portion 38 of memory element $CE_{i,j}$ comprises no thinned-down area. Further, memory element $CE_{i,j}$ comprises no source and drain regions 35 and transistor $T_{i,j}$ comprises no source and drain regions 31.

Figure 8:
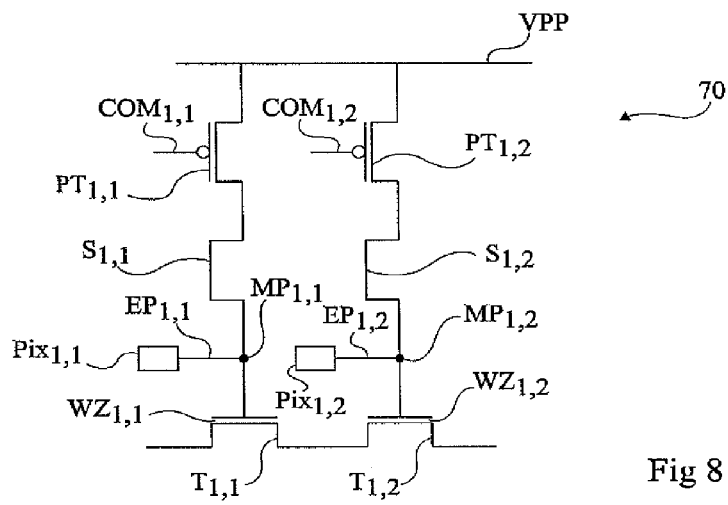
FIG. 8 shows an electric diagram of an integrated circuit according to another embodiment of the present invention.

FIG. 8 shows a partial electric diagram of an integrated circuit 70 according to another embodiment of the present invention. In the present embodiment, pixels $Pix_{i,j}$ correspond to metal portions of penultimate level $M_3$. In FIG. 8, two pixels $Pix_{1,1}$ and $Pix_{1,2}$ of a pixel array have been shown. The electric diagram of circuit 70 is similar to the electric diagram of circuit 30 of FIG. 5, with the difference that coupling element $CE_{i,j}$ is replaced with a conduction path $S_{i,j}$ electrically connecting metal portion $MP_{i,j}$ to a conduction terminal of MOS power transistor $PT_{i,j}$, the other conduction terminal of transistor $PT_{i,j}$ being connected to the source of high reference voltage VPP. Transistor $PT_{i,j}$ corresponds, for example, to a P-channel MOS transistor. Connection path $S_{i,j}$ corresponds to the serializing of vias and of metal portions of different metallization levels. In particular, conduction path $S_{i,j}$ comprises a metal portion of the penultimate level. The method for manufacturing circuit 70 uses certain steps of the method for manufacturing circuit 30, connection path $S_{i,j}$ being formed in parallel with electric path $EP_{i,j}$.

In the same way as for circuit 30 of FIG. 5, a write operation comprises altering, for certain pixels $Pix_{i,j}$, the gate insulator of the associated transistor $T_{i,j}$. For this purpose, the associated power transistor $PT_{i,j}$ is turned on and substrate 12 is set to the low reference voltage. This results in a rise of the gate voltage of transistor $T_{i,j}$. The voltage obtained between the gate of transistor $T_{i,j}$ and the underlying substrate is sufficiently high to cause the breakdown of transistor $T_{i,j}$. Transistor $PT_{i,j}$ is a power transistor capable of accepting voltage VPP.

In the same way as for circuit 10 shown in FIG. 2, a read operation of circuit 70 is performed by removing the metal portions from the last metallization level. An interruption of conduction path $S_{i,j}$ is thus obtained. Thereby, each pixel $Pix_{i,j}$ having an unaltered write area $W_{i,j}$ is floating while each pixel $Pix_{k,l}$ having an altered write area $W_{k,l}$ is electrically connected to substrate 12. Substrate 12 is then set to low reference voltage GND and a method of PVC or C-AFM type may be implemented as described previously.

Figure 9:
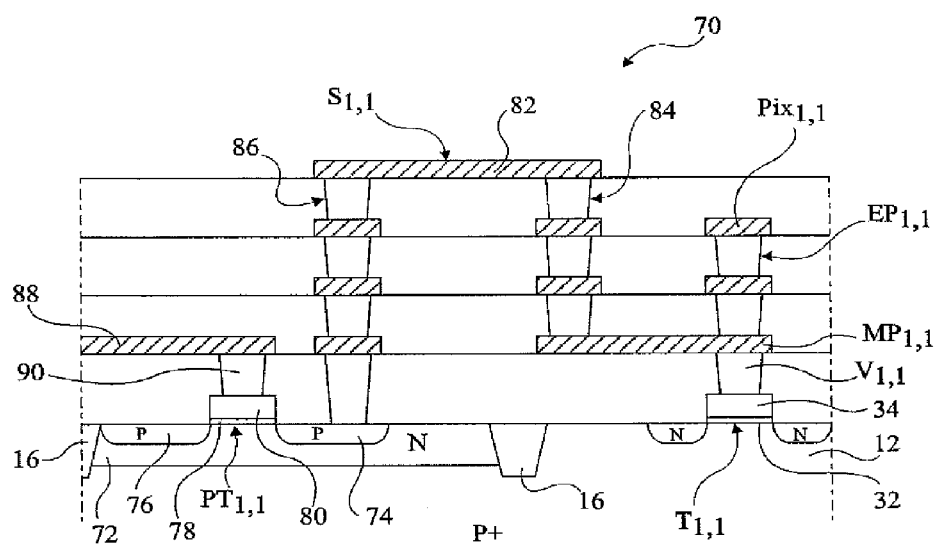
FIG. 9 is a partial simplified cross-section view of the circuit of FIG. 8.

FIG. 9 is a cross-section view of pixel $Pix_{1,1}$, of conduction path $S_{1,1}$, and of transistor $PT_{1,1}$. Transistor $PT_{1,1}$ is, as an example, a P-type MOS transistor formed at the level of an N-type well 72 which extends into substrate 12. Transistor $PT_{1,1}$ comprises doped regions 74, 76 which extend in well 72 on either side of an insulating portion 78 covering substrate 12. A conductive portion 80 covers insulating portion 78. Region 74 corresponds to the drain of transistor $PT_{1,1}$ and region 76 corresponds to the source of transistor $PT_{1,1}$. Region 76 is connected to the source of voltage VPP, not shown in FIG. 9. As an example, conduction path $S_{1,1}$ comprises a metal portion 82 of metallization level $M_4$ which is connected, at one end, to metal portion $MP_{1,1}$ by a first stacking 84 of vias and of metal portions of metallization levels $M_2$ and $M_3$ and is connected, at the other end, to drain 74 of transistor $PT_{1,1}$ by a second stacking 86 of vias and of metal portions of metallization levels $M_1$ to $M_3$. A metal portion 88 of the first metallization level connected to gate 80 of transistor $PT_{1,1}$ by a via 90 has further been shown in FIG. 9.

Figure 10:
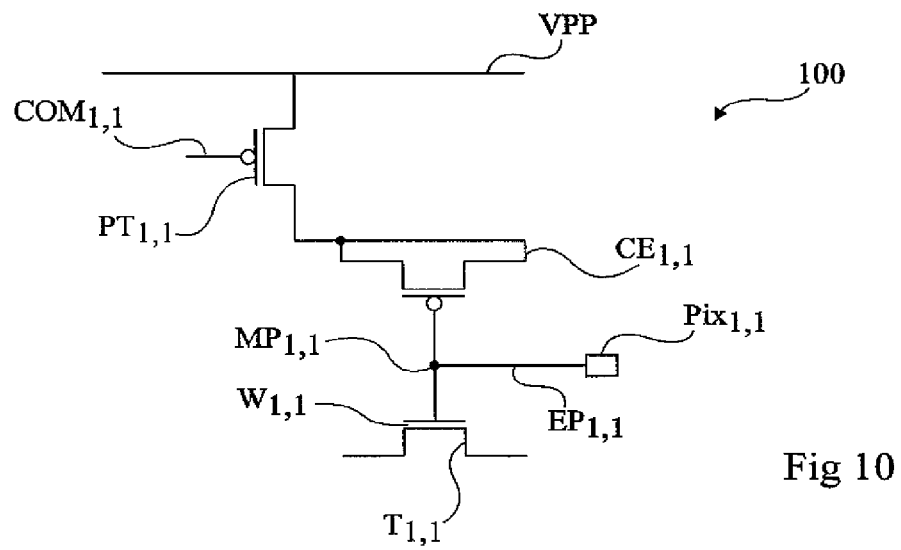
FIG. 10 shows an electric diagram of an integrated circuit according to another embodiment of the present invention.

FIG. 10 shows a partial electric diagram of an integrated circuit 100 according to another embodiment of the present invention. In the present embodiment, pixels $Pix_{i,j}$ correspond to metal portion of last metallization level $M_4$. In FIG. 10, a pixel $Pix_{1,1}$ of a pixel array has been shown. Each pixel $Pix_{i,j}$ has a structure similar to that of circuit 30. However, for circuit 100, coupling element $CE_{i,j}$ corresponds to a MOS capacitor. It for example is a so-called thick oxide MOS transistor having its conduction terminals (source and drain) connected to power transistor $PT_{i,j}$ and having its gate connected to pixel $Pix_{i,j}$. The method for manufacturing circuit 100 uses some steps of the method for manufacturing circuit 30.

In the same way as for circuit 30 of FIG. 5, an image writing operation in circuit 100 comprises altering, for some pixels $Pix_{i,j}$, the gate insulator of the associated transistor $T_{i,j}$. For this purpose, the associated power transistor $PT_{i,j}$ is turned on and substrate 12 of circuit 100 is set to low reference voltage GND. This results in a rise of the gate voltage of transistor $CE_{i,j}$ and, by capacitive coupling, in a rise of the voltage at the source and drain of this transistor. This translates as a sufficient rise of the gate voltage of transistor $T_{i,j}$. The voltage between the gate of transistor $T_{i,j}$ and the underlying substrate 12 is sufficiently high to cause the breakdown of the gate insulator of transistor $T_{i,j}$.

An read operation of the image stored in circuit 100 is performed in the same way as for circuit 30 of FIG. 6, with thick-oxide transistor $CE_{i,j}$ ensuring the electric insulation of pixel $Pix_{i,j}$.

Figure 11:
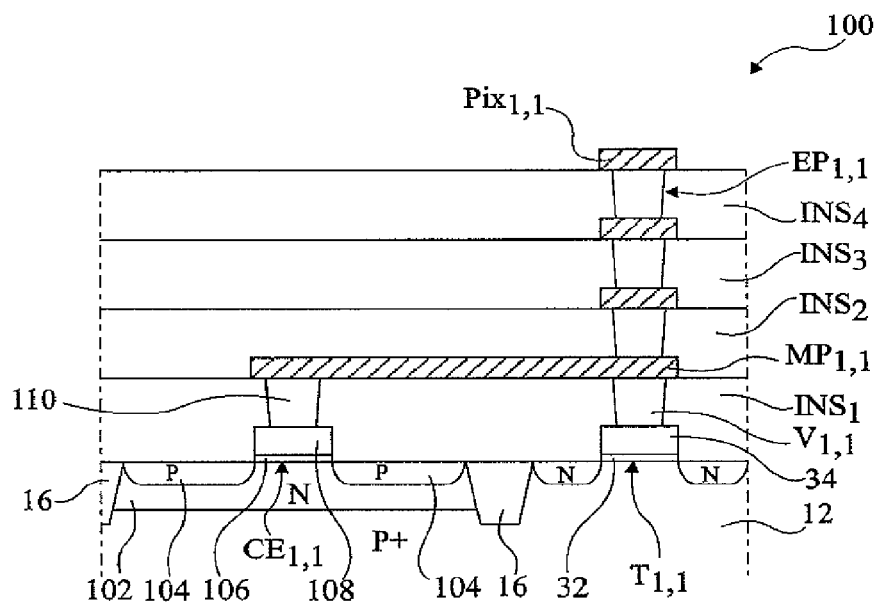
FIG. 11 is a partial simplified cross-section view of the circuit of FIG. 10.

FIG. 11 is a cross-section view of pixel $Pix_{1,1}$, of the associated electric path $EP_{1,1}$ and coupling element $CE_{1,1}$. Coupling element $CE_{1,1}$ is, as an example, a P-type MOS transistor formed at the level of an N-type well 102 which extends in substrate 12. Transistor $CE_{1,1}$ comprises doped regions 104 which extend in well 102 on either side of an insulating portion 106 covering substrate 12. A conductive portion 108 covers insulating portion 106. Regions 104 correspond to the drain and to the source of transistor $PT_{1,1}$. Regions 104 are connected to a conduction terminal of power transistor $PT_{1,1}$, not shown. Insulating portion 106 forms the gate insulator of transistor $CE_{1,1}$ and conductive portion 108 forms the gate of transistor $CE_{1,1}$. The metal portion $MP_{1,1}$ associated with pixel $Pix_{1,1}$ is connected by a via 110 to gate 108 of transistor $CE_{1,1}$.

Specific embodiments of the present invention have been described. Various alterations and modifications will occur to those skilled in the art. In particular, although in the previously-described embodiments, the integrated circuits comprise four metallization levels, it should be clear that the present invention may be implemented for an integrated circuit comprising a different number of metallization levels.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for storing an image in an integrated circuit, comprising:
    forming an array of pixels on a substrate, each pixel comprising a metal portion of a metallization level or a via level and a programmable insulating portion connected between the metal portion and the substrate; and
    programming the array of pixels by altering the insulating portion of selected pixels to cause the metal portion to be electrically connected to the substrate, wherein the selected pixels have a first state and non-selected pixels have a second state, and wherein the states of the pixels in the array of pixels define an image stored in the integrated circuit.

2. A method for storing an image as defined in claim 1, further comprising forming metal tracks of a last metallization level configured to address selected pixels of the array of pixels during programming thereof.

3. A method for storing an image as defined in claim 1, wherein forming an array of pixels further comprises, for each pixel, forming a dual gate transistor having a first gate connected to the metal portion and a second gate connected to a selection element configured to program the pixel.

4. A method for storing an image as defined in claim 1, wherein forming an array of pixels further comprises, for each pixel, forming a MOS capacitor having a first terminal connected to the metal portion and a second terminal connected to a selection element configured to program the pixel.

5. A method for storing an image as defined in claim 1, wherein forming an array of pixels further comprises, for each pixel, forming a capacitive coupling element having a first terminal connected to the metal portion and a second terminal connected to a selection element configured to program the pixel.

6. A method for storing an image as defined in claim 1, wherein forming an array of pixels further comprises, for each pixel, forming a removable conduction path connected between the metal portion and a selection element configured to program the pixel.

7. A method for storing an image as defined in claim 1, further comprising optically reading the electrical state of the pixels in the array of pixels.

8. A method for storing an image as defined in claim 1, further comprising reading the electrical states of the pixels in the array of pixels by passive voltage contrast imaging.

9. A method for storing an image as defined in claim 1, further comprising reading the electrical states of the pixels in the array of pixels by conduction atomic force microscopy.

\* \* \* \* \*